United States Patent [19]

Pan et al.

[11] Patent Number: 5,652,152
[45] Date of Patent: Jul. 29, 1997

[54] PROCESS HAVING HIGH TOLERANCE TO BURIED CONTACT MASK MISALIGNMENT BY USING A PSG SPACER

[75] Inventors: Yang Pan, Pine Grove, Singapore; Lap Chan, San Francisco, Calif.; Ravi Sundaresan, Singapore, Singapore

[73] Assignee: Chartered Semiconductor Manufacturing Pte, Ltd., Singapore, Singapore

[21] Appl. No.: 636,086

[22] Filed: Apr. 22, 1996

[51] Int. Cl.$^6$ ............................................. H01L 21/441
[52] U.S. Cl. ........................ 437/26; 437/191; 437/200; 437/240
[58] Field of Search ..................... 437/26, 162, 164, 437/191, 193, 200, 240

[56] References Cited

U.S. PATENT DOCUMENTS

| | | | |
|---|---|---|---|
| 5,232,874 | 8/1993 | Rhodes et al. | 437/200 |
| 5,315,150 | 5/1994 | Furuhata | 437/162 |
| 5,350,712 | 9/1994 | Shibata | 437/195 |
| 5,506,172 | 4/1996 | Tang | 437/191 |
| 5,576,242 | 11/1996 | Liu | 437/191 |

*Primary Examiner*—Chandra Chaudhari
*Attorney, Agent, or Firm*—George O. Saile; Rosemary L. S. Pike

[57] ABSTRACT

A new method of forming improved buried contact junctions is described. A layer of polysilicon overlying gate silicon oxide is provided over the surface of a semiconductor substrate and etched away to provide an opening to the substrate where a planned buried contact junction will be formed. A second doped polysilicon layer and a tungsten silicide layer are deposited and patterned to provide gate electrodes and a contact overlying the planned buried contact junction and providing an opening to the substrate where a planned source/drain region will be formed adjoining the planned buried contact junction and wherein a portion of the polysilicon layer not at the polysilicon contact remains as residue. The residue is etched away whereby a trench is etched into the substrate at the junction of the planned source/drain region and the planned buried contact junction. A doped glasseous layer is deposited overlying the patterned tungsten silicide/polysilicon layer and within the trench, then isotropically etched away until it remains only partially filling the trench. The substrate is oxidized to drive-in dopant from the doped glasseous layer within the trench into the surrounding substrate. Ions are implanted to form the planned source/drain region. Dopant is outdiffused from the second polysilicon layer to form the planned buried contact junction wherein the dopant surrounding the trench provides a conduction channel between the source/drain region and the adjoining buried contact junction.

23 Claims, 5 Drawing Sheets 5,652,152

PROCESS HAVING HIGH TOLERANCE TO BURIED CONTACT MASK MISALIGNMENT BY USING A PSG SPACER

BACKGROUND OF THE INVENTION

1. Field of the Invention

The invention relates to the fabrication of integrated circuit devices, and more particularly, to a method of forming buried contacts having high tolerance to buried contact mask misalignment in the fabrication of integrated circuits.

2. Description of the Prior Art

Referring to FIG. 1, a typical buried contact is formed by depositing a doped layer of polysilicon 16 over and on the planned buried contact region in a semiconductor substrate 10 and heating the structure. The buried contact region 20 is doped by outdiffusion of dopants from the doped polysilicon layer 16 into the silicon substrate. The doped polysilicon layer is allowed to remain on the buried contact region as its contact. Gate electrode 18 and source/drain region 22 are also formed. If there is misalignment of the mask during etching of the polysilicon 16, a portion of the semiconductor substrate within the buried contact area will be exposed. During polysilicon overetching, a buried contact trench 25 will be etched. If the trench is deep enough, it may cause disconnection between the buried contact 20 and the source/drain region 22.

U.S. Pat. No. 5,350,712 to Shibata teaches the use of an additional metal width around a metal line to overcome mask misalignment problems causing etching of the semiconductor substrate.

SUMMARY OF THE INVENTION

A principal object of the present invention is to provide an effective and very manufacturable method of forming buried contact junctions.

Another object of the present invention is to provide a method of forming buried contact junctions which will not be harmed by mask misalignment.

In accordance with the objects of this invention a new method of forming improved buried contact junctions is achieved. A layer of gate silicon oxide is provided over the surface of a semiconductor substrate. A layer of polysilicon is deposited over the gate oxide layer. The gate oxide and polysilicon layers are etched away where they are not covered by a mask to provide an opening to the semiconductor substrate where a planned buried contact junction will be formed. A doped second polysilicon layer is provided overlying the first polysilicon layer and the planned buried contact junction. A tungsten silicide layer is deposited overlying the second polysilicon layer. The tungsten silicide and second polysilicon layers are etched away where they are not covered by a mask to provide gate electrodes and a polysilicon contact overlying the planned buried contact junction and providing an opening to the semiconductor substrate where a planned source/drain region will be formed adjoining the planned buried contact junction and wherein a portion of the polysilicon layer not at the polysilicon contact remains as residue. The residue is etched away whereby a trench is etched into the semiconductor substrate at the junction of the planned source/drain region and the planned buried contact junction. A doped glasseous layer is deposited overlying the patterned polysilicon layer and within the trench. The doped glasseous layer is isotropically etched away until the doped glasseous layer remains only partially filling the trench. The semiconductor substrate is oxidized to drive-in dopant from the doped glasseous layer within the trench into the surrounding semiconductor substrate. Ions are implanted to form the planned source/drain region. Dopant is outdiffused from the second polysilicon layer to form the planned buried contact junction wherein the dopant surrounding the trench provides a conduction channel between the source/drain region and the adjoining buried contact junction completing the fabrication of the integrated circuit device.

Also in accordance with the objects of the invention, a new integrated circuit device having a conduction channel between a source/drain region and an adjoining buried contact junction is achieved. The integrated circuit device comprises a gate electrode on the surface of a semiconductor substrate, source/drain regions within the semiconductor substrate surrounding the gate electrode, a polysilicon contact on the surface of the semiconductor substrate, a buried contact junction underlying the polysilicon contact and adjoining one of the source/drain regions, a glasseous material partially filling a trench in the semiconductor substrate at the junction between the buried contact junction and one of the source/drain regions, and a heavily doped region within the semiconductor substrate surrounding the trench wherein the heavily doped region provides a conduction channel between the source/drain region and the adjoining buried contact junction.

BRIEF DESCRIPTION OF THE DRAWINGS

In the accompanying drawings forming a material part of this description, there is shown.

DESCRIPTION OF THE PREFERRED EMBODIMENTS

FIGS. 2 through 6 illustrate an N channel MOSFET integrated circuit device. However, it is well understood by those skilled in the art that a P channel FET integrated circuit device could be formed by simply substituting opposite polarities to those given for the N channel embodiment. Also, in a similar way, a CMOSFET could be formed by making both N channel and P channel devices upon the same substrate.

Figure 1:
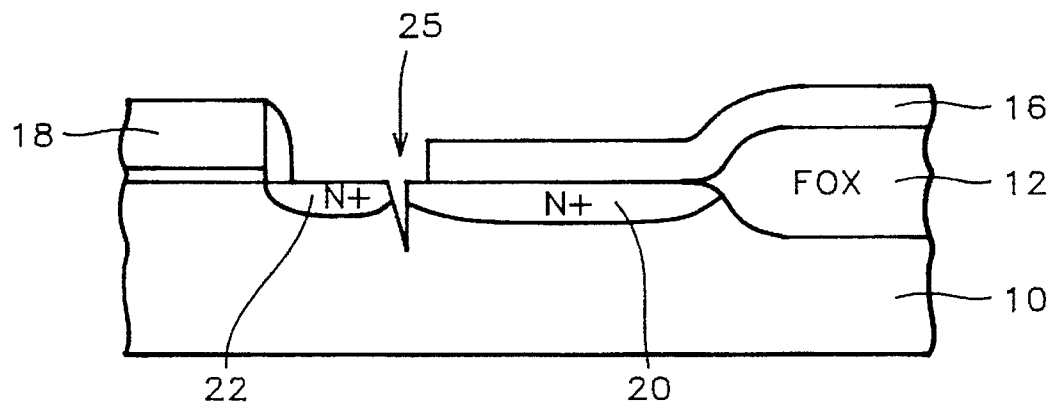
FIG. 1 schematically illustrates in cross-sectional representation an embodiment of the prior art.
Figure 2:
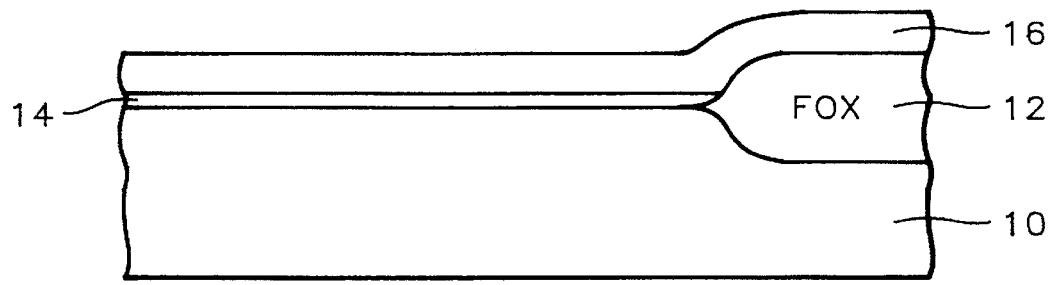
FIGS. 2 through 11 schematically illustrate in cross-sectional representation a preferred embodiment of the present invention.

Referring now more particularly to FIG. 2, there is shown a portion of a partially completed integrated circuit. There is shown a monocrystalline semiconductor substrate 10 in which there are formed field oxide regions 12. A gate oxide layer 14 is grown on the surface of the semiconductor substrate, typically to a thickness of between about 40 to 150 Angstroms. A polysilicon layer 16 is deposited over the gate oxide layer to a thickness of between about 400 to 700 Angstroms.

Figure 3:
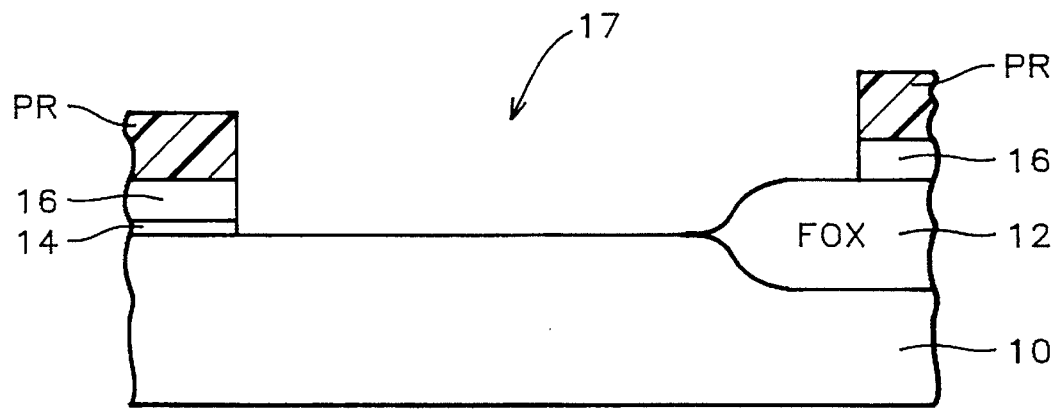

A buried contact mask is used to form the photoresist mask PR over the surface of the substrate, as shown in FIG. 3. The gate oxide layer 14 and the polysilicon layer 16 are etched away where they are not covered by the mask to form the buried contact opening 17. The photoresist mask is removed.

Figure 4:
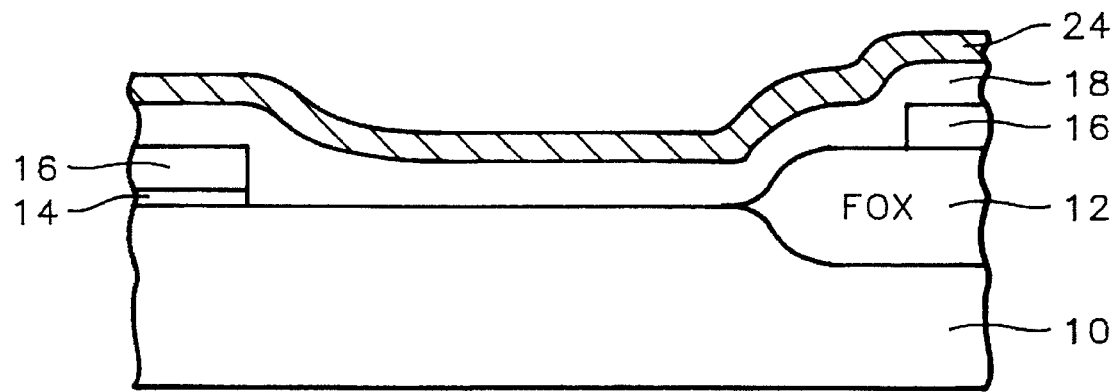

Referring now to FIG. 4, the polysilicon layer 18 is blanket deposited by low pressure chemical vapor deposition (LPCVD) to a thickness of between about 700 to 2500 Angstroms. The polysilicon layer 18 is doped by POCl$_3$ or by ion implantation, such as with phosphorus ions at a dosage of between about 1 E 15 to 1 E 16 atoms/cm$^2$. A layer of tungsten silicide 24 is deposited by chemical vapor deposition (CVD) over the polysilicon layer 18. The thickness of the tungsten silicide layer is between about 500 to 2000 Angstroms.

Figure 5:
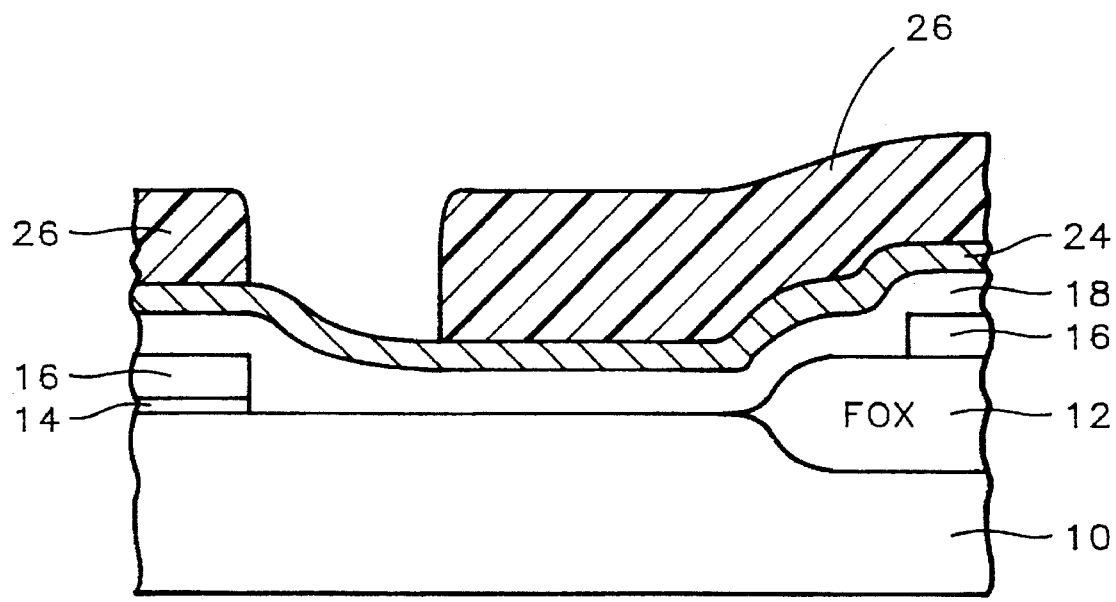

Referring now to FIG. 5, a layer of photoresist 26 is coated over the tungsten silicide layer and patterned to form a photoresist mask.

Figure 6:
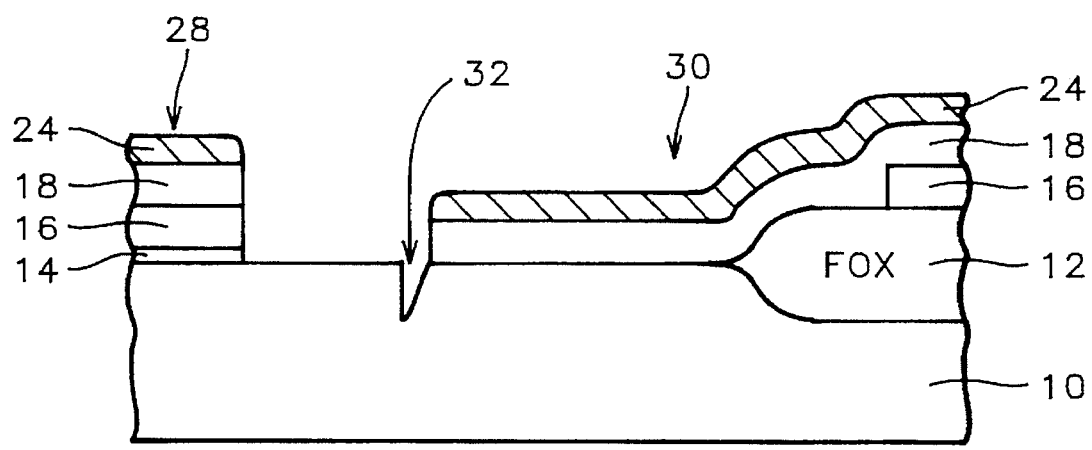

As illustrated in FIG. 6, the polysilicon layer 18 and tungsten silicide 24 are patterned to form a gate electrode 28 and tungsten silicide/polysilicon contact 30. Typically, the tungsten silicide and polysilicon are etched away where they are not covered by the mask. A portion of the polysilicon remains as residue where it is not desired. An overetching step is performed to remove this polysilicon residue. If the mask is misaligned, during overetching, a trench 32 is etched into the substrate where it is not protected by the gate oxide layer 14. The trench 32 may cause buried contact to source/drain disconnection.

Figure 7:
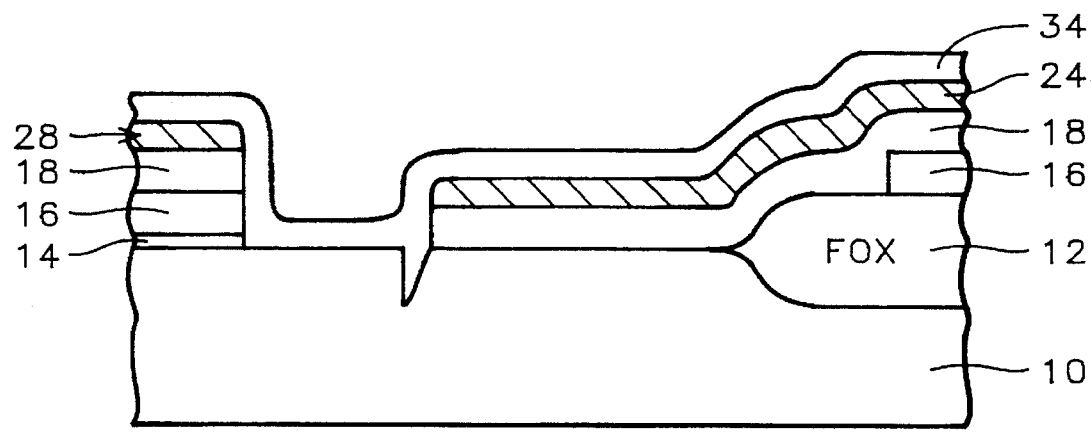

The process of the invention resolves the possible disconnection problem. Referring now to FIG. 7, a layer 34 of phosphosilicate glass (PSG) comprising between about 2 to 9% phosphorus is deposited over the patterned polysilicon layer and within the trench to a thickness of between about 5000 to 7000 Angstroms. Alternatively, layer 34 could be P112 spin-on-glass (SOG) doped with about 2% phosphorus.

Figure 8:
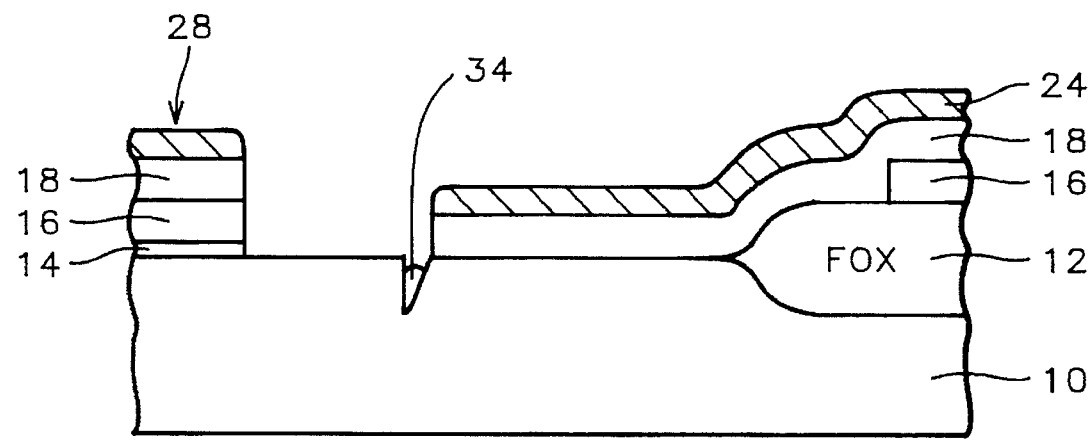

The PSG or SOG 34 is isotropically dry etched to remove layer 34 except within the trench, as shown in FIG. 8. A buffered oxide etch (BOE) is used to clean away oxide residue.

Figure 9:
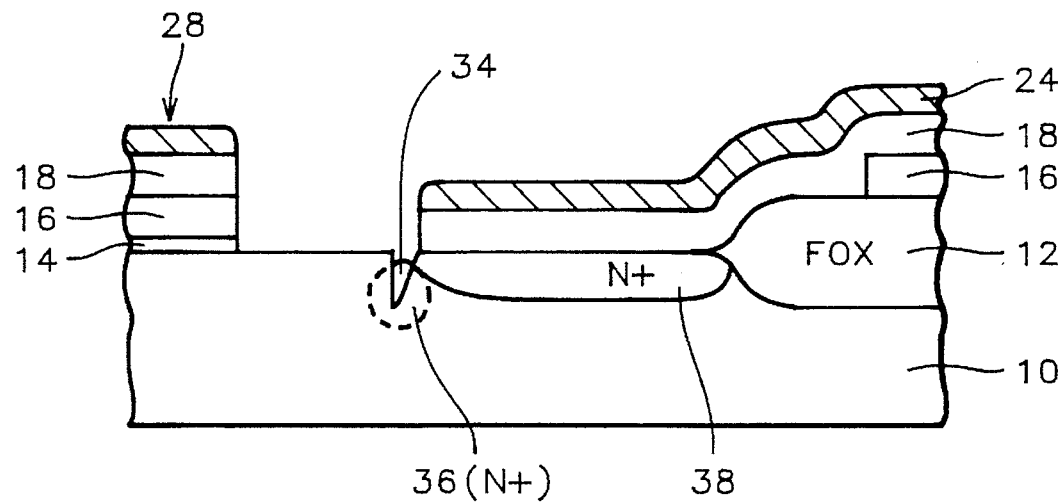

Referring now to FIG. 9, a thermal oxidation is performed to drive in N+ from the PSG layer 34 in the trench into the substrate surrounding the trench, as illustrated by 36. The wafer is oxidized at a temperature of between about 850° to 950° C. for between about 10 to 30 minutes. This thermal oxidation also re-oxidizes the gate oxide 14 under the polysilicon gate 28. This anneals out etch induced edge defects. The thermal cycle also drives in the doping from layer 18 into the substrate to form the buried contact region 38.

Figure 10:
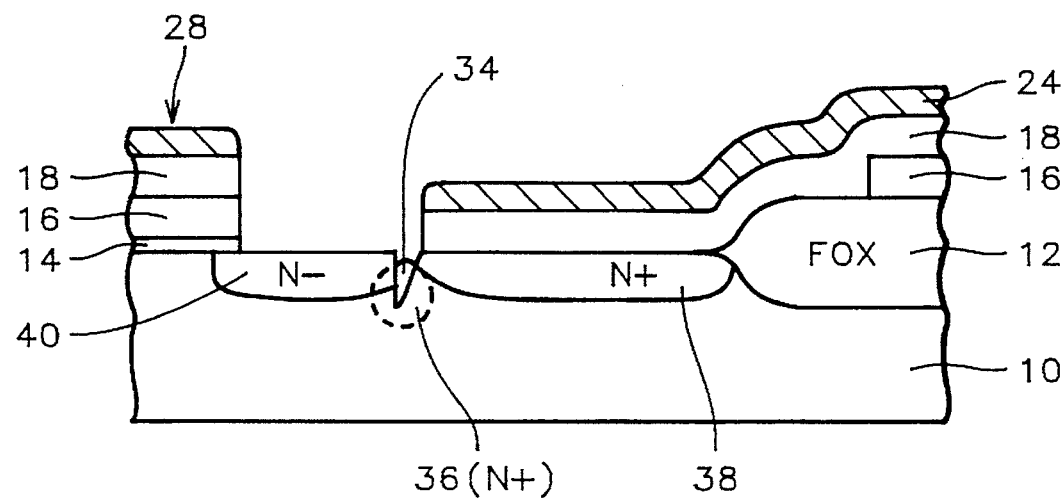
Figure 11:
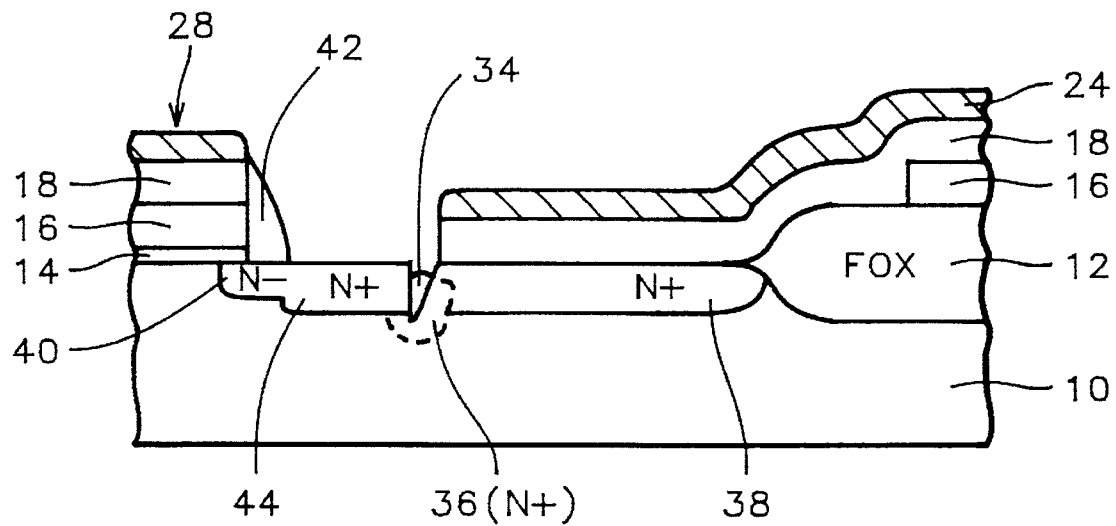

Processing continues as usual with ion implantation to form N− region 40, as shown in FIG. 10. Oxide spacers 42 are formed on the sidewalls of the gate electrode 28. Then, ions are implanted to formed heavily doped source/drain regions 44, as shown in FIG. 11.

Figure 12:
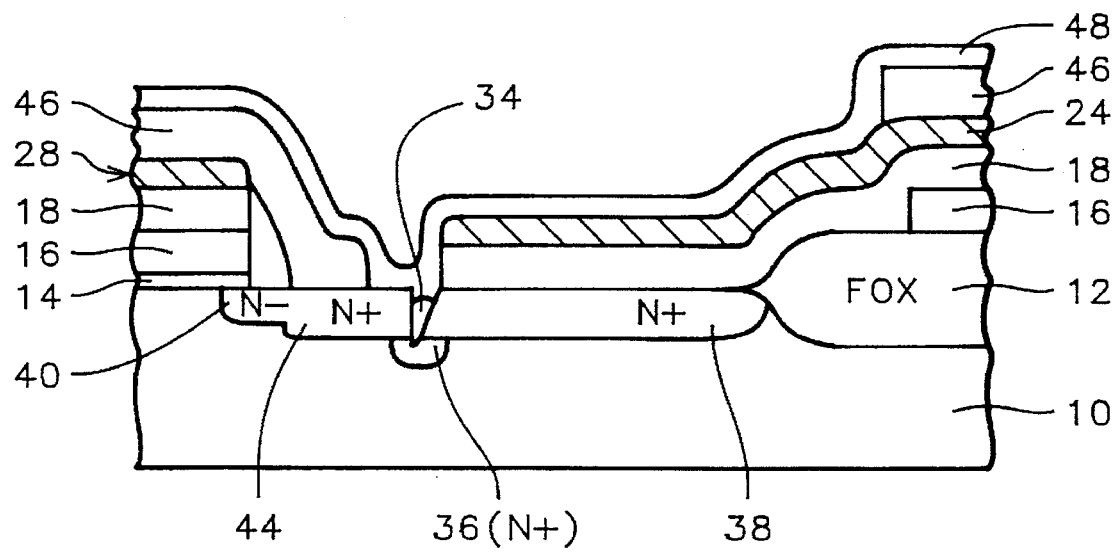
FIG. 12 schematically illustrates in cross-sectional representation a static random access memory (SRAM) device fabricated according to the process of the present invention.

Referring now to FIG. 12, an interpoly oxide 46 is deposited over the top surfaces of the substrate to a thickness of between about 2000 to 5000 Angstroms and patterned. Finally, a third layer of polysilicon 48 is deposited overall.

The static random access memory (SRAM) device of the present invention having a conduction channel between a source/drain region and an adjoining buried contact junction is illustrated in FIG. 12. The integrated circuit device comprises a gate electrode 28 on the surface of a semiconductor substrate 10, source/drain regions 44 within the semiconductor substrate surrounding the gate electrode, a polysilicon contact 18 on the surface of the semiconductor substrate, a buried contact junction 38 underlying the polysilicon contact and adjoining one of the source/drain regions, a glasseous material 34 partially filling a trench in the semiconductor substrate at the junction between the buried contact junction and one of the source/drain regions, and a heavily doped region 36 within the semiconductor substrate surrounding the trench wherein the heavily doped region provides a conduction channel 36 between the source/drain region 44 and the adjoining buried contact junction 38.

The process of the invention can be used in making any device including a buried contact process. The process of the invention provides a conduction channel between the buried contact and the source/drain even if the polysilicon masks are severely misaligned.

While the invention has been particularly shown and described with reference to the preferred embodiments thereof, it will be understood by those skilled in the art that various changes in form and details may be made without departing from the spirit and scope of the invention.

What is claimed is:

1. A method of fabricating an integrated circuit device comprising:

providing a layer of gate silicon oxide over the surface of a semiconductor substrate;

depositing a first layer of polysilicon overlying said gate silicon oxide layer;

etching away said first polysilicon and said gate oxide layer where they are not covered by a mask to provide an opening to said semiconductor substrate where a planned buried contact junction will be formed;

depositing a second polysilicon layer overlying said first polysilicon layer and said planned buried contact junction and doping said second polysilicon layer;

depositing a tungsten silicide layer overlying said second polysilicon layer;

etching away said tungsten silicide and said second polysilicon layers where they are not covered by a mask to provide gate electrodes and a polysilicon contact overlying said planned buried contact junction and providing an opening to said semiconductor substrate where a planned source/drain region will be formed wherein said planned source/drain region is adjacent to said planned buried contact junction and wherein a portion of said polysilicon layer not at said polysilicon contact remains as residue;

etching away said residue wherein a trench is etched into said semiconductor substrate at the junction of said planned source/drain region and said planned buried contact junction;

depositing a doped glasseous layer overlying said patterned polysilicon layer and within said trench;

isotropically etching away said doped glasseous layer until said doped glasseous layer remains only partially filling said trench;

oxidizing said semiconductor substrate to drive-in dopant from said doped glasseous layer within said trench into said surrounding semiconductor substrate;

outdiffusing dopant from said second polysilicon layer to form said planned buried contact junction;

implanting ions to form said planned source/drain region;

depositing a layer of interpoly oxide overlying said patterned tungsten silicide and second polysilicon layers and patterning said interpoly oxide layer; and depositing a third polysilicon layer overlying said patterned interpoly oxide wherein said dopant surrounding said trench provides a conduction channel between said source/drain region and said buried contact junction completing said fabrication of said integrated circuit device.

2. The method according to claim 1 wherein said first polysilicon layer has a thickness of between about 400 to 700 Angstroms.

3. The method according to claim 1 wherein said second polysilicon layer has a thickness of between about 700 to 2500 Angstroms.

4. The method according to claim 1 wherein said second polysilicon layer is doped by diffusion of $POCl_3$.

5. The method according to claim 1 wherein said second polysilicon layer is doped by ion implantation of phosphorus ions with a dosage of between about 1 E 15 to 1 E 16 atoms/$cm^2$.

6. The method according to claim 1 wherein said tungsten silicide layer has a thickness of between about 500 to 2000 Angstroms.

7. The method according to claim 1 wherein said doped glasseous layer comprises phosphosilicate glass doped with between about 2 to 9% phosphorus.

8. The method according to claim 1 wherein said doped glasseous layer comprises P112 spin-on-glass doped with about 2% phosphorus.

9. The method according to claim 1 further comprising performing a buffered oxide etch following said step of isotropically etching away said doped glasseous layer wherein said buffered oxide etch removes oxide residue.

10. The method according to claim 1 wherein said oxidizing said semiconductor substrate is a thermal oxidation.

11. The method according to claim 1 wherein said oxidizing said semiconductor substrate also re-oxidizes said gate silicon oxide layer underlying said gate electrodes.

12. The method according to claim 1 wherein said outdiffusing dopant from said second polysilicon layer is done during said oxidizing step.

13. A method of fabricating an integrated circuit device having a conduction channel between a source/drain region and an adjoining buried contact junction comprising:

providing a first layer of polysilicon over a layer of gate silicon oxide over the surface of a semiconductor substrate;

etching away said first polysilicon and said gate oxide layer where they are not covered by a mask to provide an opening to said semiconductor substrate where a planned buried contact junction will be formed;

depositing a second polysilicon layer overlying said first polysilicon layer and said planned buried contact junction and doping said second polysilicon layer;

depositing a tungsten silicide layer overlying said second polysilicon layer;

etching away said tungsten silicide and said second polysilicon layers where they are not covered by a mask to provide gate electrodes and a polysilicon contact overlying said planned buried contact junction and providing an opening to said semiconductor substrate where a planned source/drain region will be formed wherein said planned source/drain region is adjacent to said planned buried contact junction and wherein a portion of said polysilicon layer not at said polysilicon contact remains as residue;

etching away said residue wherein a trench is etched into said semiconductor substrate at the junction of said planned source/drain region and said planned buried contact junction;

depositing a doped glasseous layer overlying said patterned polysilicon layer and within said trench;

isotropically etching away said doped glasseous layer until said doped glasseous layer remains only partially filling said trench;

oxidizing said semiconductor substrate whereby dopant is driven in from said doped glasseous layer within said trench into said surrounding semiconductor substrate and whereby dopant is outdiffused from said second polysilicon layer to form said planned buried contact junction;

implanting ions to form said planned source/drain region wherein said dopant surrounding said trench provides a conduction channel between said source/drain region and said buried contact junction;

depositing a layer of interpoly oxide overlying said patterned tungsten silicide and second polysilicon layers and patterning said interpoly oxide layer; and depositing a third polysilicon layer overlying said patterned interpoly oxide completing said fabrication of said integrated circuit device.

14. The method according to claim 13 wherein said first polysilicon layer has a thickness of between about 400 to 700 Angstroms.

15. The method according to claim 13 wherein said second polysilicon layer has a thickness of between about 700 to 2500 Angstroms.

16. The method according to claim 13 wherein said second polysilicon layer is doped by diffusion of $POCl_3$.

17. The method according to claim 13 wherein said second polysilicon layer is doped by ion implantation of phosphorus ions with a dosage of between about 1 E 15 to 1 E 16 atoms/$cm^2$.

18. The method according to claim 13 wherein said tungsten silicide layer has a thickness of between about 500 to 2000 Angstroms.

19. The method according to claim 13 wherein said doped glasseous layer comprises phosphosilicate glass doped with between about 2 to 9% phosphorus.

20. The method according to claim 13 wherein said doped glasseous layer comprises P112 spin-on-glass doped with about 2% phosphorus.

21. The method according to claim 13 further comprising performing a buffered oxide etch following said step of isotropically etching away said doped glasseous layer wherein said buffered oxide etch removes oxide residue.

22. The method according to claim 13 wherein said oxidizing said semiconductor substrate is a thermal oxidation.

23. The method according to claim 13 wherein said oxidizing said semiconductor substrate also re-oxidizes said gate silicon oxide layer underlying said gate electrodes.

* * * * *